United States Patent
El-Bahrawy

(10) Patent No.: US 11,364,935 B2
(45) Date of Patent: Jun. 21, 2022

(54) ROBUST AUTONOMOUS DRIVE DESIGN

(71) Applicant: Volvo Car Corporation, Gothenburg (SE)

(72) Inventor: Ahmed El-Bahrawy, Sävedalen (SE)

(73) Assignee: Volvo Car Corporation, Gothenburg (SE)

( * ) Notice: Subject to any disclaimer, the term of this patent is extended or adjusted under 35 U.S.C. 154(b) by 42 days.

(21) Appl. No.: 16/926,839

(22) Filed: Jul. 13, 2020

(65) Prior Publication Data
US 2021/0024088 A1    Jan. 28, 2021

Related U.S. Application Data

(60) Provisional application No. 62/876,805, filed on Jul. 22, 2019.

(51) Int. Cl.
*B60W 60/00* (2020.01)
*B60W 50/029* (2012.01)
*B60W 50/00* (2006.01)

(52) U.S. Cl.
CPC ...... *B60W 60/0015* (2020.02); *B60W 50/029* (2013.01); *B60W 2050/0083* (2013.01); *B60W 2050/0292* (2013.01)

(58) Field of Classification Search
CPC .......... B60W 60/0015; B60W 50/029; B60W 2050/0083; B60W 2050/0292; B60K 2370/175; G06F 30/20; G05D 1/0236; G05D 1/0253; G05D 1/0257; G05D 1/0259; G05D 1/0223; G05D 1/0221; G05D 1/0276; G05D 2201/02
See application file for complete search history.

(56) References Cited

U.S. PATENT DOCUMENTS

2018/0255705 A1*  9/2018  Keski-Luopa ......... A01D 69/02

OTHER PUBLICATIONS

Dec. 7, 2020 European Search Report issued on International Application No. 20186957.
Nilsson et al.,"Preliminary results on correct-by-construction control software synthesis for adaptive cruise control", Proceeding of the 53rd IEEE conference on decision control,Dec. 15, 2014, pp. 816-823.
Nemeth, "Robust LPV design with neural network for the steering control of autonomous vehicles", Proceedings of the 18th European Control Conference, Jun. 25, 2019, pp. 4134-4139.
Dorsa et al.,"Verifying Robustness of Human-Aware Autonomous Cars", vol. 51, No. 34, Feb. 8, 2019.

* cited by examiner

*Primary Examiner* — Marthe Y Marc-Coleman
(74) *Attorney, Agent, or Firm* — Clements Bernard Walker; Christopher L. Bernard

(57) ABSTRACT

A method, a non-transitory computer-readable medium, and a system of providing an autonomous driving (AD) generally valid robust Sense-Act-function input-output Sense-Act-interdependency relations knowledge-based map that is used as look-up table instructions to implement general Sense-Act-control capabilities of an AD system in an AD vehicle for general robust solution decision making with global situational awareness, closed-loop control, noise and system degradation-tolerance, and fail-safe management and without large and complex code that is difficult, bug-sensitive, and both time and resource consuming to both develop and execute.

20 Claims, 11 Drawing Sheets

ROBUST AUTONOMOUS DRIVE DESIGN

CROSS-REFERENCE TO RELATED APPLICATION

The present disclosure claims the benefit of priority of U.S. Provisional Patent Application No. 62/876,805, filed on Jul. 22, 2019, and entitled "ROBUST AUTONOMOUS DRIVE DESIGN," the contents of which are incorporated in full by reference herein.

TECHNICAL FIELD

The present disclosure relates generally to the automotive and autonomous driving (AD) fields. More particularly, the present disclosure relates to a robust AD design that effectively and efficiently enables the replacement of a human driver in a vehicle, providing enhanced robust AD capabilities while ensuring qualification, availability, and safety.

BACKGROUND

In designing an AD system, with the AD function replacing the human driver, it is necessary that the AD system is qualified to robustly and safely handle a multitude of vehicle systems, in a multitude of operational domains, and with a multitude of operational loads. Thus, there are a huge number of design parameters, with varying ranges and interaction combinations, each with specific noises to be handled over time. Thus, there are almost an infinite number of nominal load cases, each with specific noises, that must be robustly and safely considered and managed.

The human driver is well suited to accomplishing this task, with a brain as a processor, eyes and ears as sensors, and hands and feet as actuators to operate a vehicle's acceleration, braking, and steering systems simultaneously. The human driver efficiently performs robust data processing, with sensor fusion, learning/intuitiveness/instinctiveness, attention/alertness, evasiveness, analysis, etc. The human driver performs data storage and reuses as memory stored predetermined experiences that lead to fast robust "Sense-Act"-performance. The human driver also implements efficient "Sense-Act"-decision making processes, with closed-loop adaptive control, and robust full system noises management. All of these things are achieved without the need for large and complex code that would be difficult, bug-sensitive, and both time- and resource-consuming to develop, execute, and manage. Thus, it is challenging to replace the "human driver-vehicle-operational domain"-system with an "autonomous driver-vehicle-operational domain"-system.

It is desirable in this context to utilize a holistic deterministic approach considering the general problem definition and its general robust solutions. Robustness here requires both high availability and high safety of the full system (e.g., as required by ISO PAS 21448 Road vehicles—Safety of the intended functionality (SOTIF) and ISO 26262 Road vehicles—Functional safety (ASIL) standards), with insensitivity to disturbances, leading to available safe robust AD capabilities. Preferably, the approach is evolutionary, in that it is efficient with respect to resources and results, controlled in its complexity, easy to modify and build on, differentiable, and imposes low computational and Central Processing Unit (CPU)-time, and, thus, needed processors capacity demands.

Previously, big data approaches (e.g., Artificial Intelligence and Machine Learning) have been utilized as industry standards to manage automotive autonomous drive design, which are inherently uncertain, limited and sensitive in terms of data content, parameters, and noises, can be ineffective (e.g., in terms of needed data management and its reusability), are sensitive to disturbances (i.e., non-robust), are route/context-dependent (i.e., specific/non-general), and are computationally very demanding and expensive (in terms of data-logging, storage, analysis, CPU-time, and processors capacity demands). Big data approaches are not easily transferable to general applicable robust solutions. Thus, an analytical statistical approach is favoured over a big data approach, utilizing physics, modelling, and robustness. This would provide a general problem definition and its general robust solutions, rather than unique non-robust ones generated by the big data approach. However, the number of load cases present (i.e., a vehicle, its operational domain, and their loads-design parameters with varying ranges and interaction combinations, each with specific noises to be handled over time) can lead to a $N \times N \times \ldots \times N$-exponential problem, rendering a solution virtually unachievable and difficult to verify and validate theoretically, experimentally, and in real life.

This background provides a contextual framework for the present disclosure only. It will be readily apparent to those of ordinary skill in the art that the concepts of the robust autonomous drive design of the present disclosure may be broadened to other contextual frameworks as well, and may be implemented in other general environments.

SUMMARY

Thus, the present disclosure provides a generally valid Sense-Act-AD design that robustly and safely handles a multitude of vehicle systems, in a multitude of operational domains, and with a multitude of operational loads, just as a human driver does. This provides a robustness of AD capability, availability, and safety across the five AD stages.

In one exemplary embodiment, the present disclosure provides a method and an approach, including: creating a plurality of transfer functions for a plurality of the different parts of the full generally valid autonomous driving (AD) function full general design space; combining the plurality of transfer functions of the different parts generates a general AD function full multi-dimensional design space and its input-output (I/O)-analysis flow; defining a plurality of the desired/required AD function different dimensioning scenarios and loads to obtain their related AD function sub-problem definition and specific sub-design space input-output (I/O)-analysis flow from the full general one; incorporating robustness demands by applying a plurality of different sigma targets to the dimensioning scenarios and loads problem analysis flow's objectives and constraints to identify its design domain robust solutions towards its input design parameters different noises and tolerances; and applying one or more of weighed optimization and data mining to rank and extract interdependency patterns and relations among the dimensioning scenarios and loads-design domain robust solutions and, thus, identify and generate the desired/required AD function robust input (i.e., AD system design parameters)-output (i.e., AD function decision and control parameters) Sense-Act-interdependency relations knowledge-based map; wherein the AD function general robust Sense-Act-interdependency relations map is used as a look-up table to implement an AD system's general Sense-Act-control capabilities in an AD vehicle for a general robust solution decision making with global situational awareness, closed-loop control, noise and system degradation-tolerance, and fail-safe management and without large and complex code that is difficult, bug-sensitive, and both time and resources consuming to both develop and execute.

In another exemplary embodiment, the present disclosure provides a non-transitory computer-readable medium including a generally valid autonomous driving (AD) Sense-Act-system implementation instructions stored in a memory and executed by a processor to carry out the steps including: creating a plurality of transfer functions for a plurality of the different parts of the full generally valid autonomous driving (AD) function full general design space; combining the plurality of transfer functions of the different parts generates a general AD function full multi-dimensional design space and its input-output (I/O)-analysis flow; defining a plurality of the desired/required AD function different dimensioning scenarios and loads to obtain their related AD function sub-problem definition and specific sub-design space input-output (I/O)-analysis flow from the full general one; incorporating robustness demands by applying a plurality of different sigma targets to the dimensioning scenarios and loads problem analysis flow's objectives and constraints to identify its design domain robust solutions towards its input design parameters different noises and tolerances; and applying one or more of weighed optimization and data mining to rank and extract interdependency patterns and relations among the dimensioning scenarios and loads-design domain robust solutions and, thus, identify and generate the desired/required AD function robust input (i.e., AD system design parameters)-output (i.e., AD function decision and control parameters) Sense-Act-interdependency relations knowledge-based map; wherein the AD function general robust Sense-Act-interdependency relations map is used as a look-up table to implement an AD system's general Sense-Act-control capabilities in an AD vehicle for a general robust solution decision making with global situational awareness, closed-loop control, noise and system degradation-tolerance, and fail-safe management and without large and complex code that is difficult, bug-sensitive, and both time and resource consuming to both develop and execute.

In a further exemplary embodiment, the present disclosure provides a system, including: an autonomous driving (AD) generally valid Sense-Act-function input-output Sense-Act-interdependency relations knowledge-based map stored as a look-up table instructions in a memory and executed by a processor of an AD system of a vehicle and used for a general robust solution decision making with global situational awareness, closed-loop control, noise and system degradation-tolerance, and fail-safe management and without large and complex code that is difficult, bug-sensitive, and both time and resources consuming to both develop and execute, wherein the AD function general robust Sense-Act-interdependency relations knowledge-based map is formed by: creating a plurality of transfer functions for a plurality of the different parts of the full generally valid autonomous driving (AD) function full general design space; combining the plurality of transfer functions of the different parts generates a general AD function full multi-dimensional design space and its input-output (I/O)-analysis flow; defining a plurality of the desired/required AD function different dimensioning scenarios and loads to obtain their related AD function sub-problem definition and specific sub-design space input-output (I/O)-analysis flow from the full general one; incorporating robustness demands by applying a plurality of different sigma targets to the dimensioning scenarios and loads problem analysis flow's objectives and constraints to identify its design domain robust solutions towards its input design parameters different noises and tolerances; and applying one or more of weighed optimization and data mining to rank and extract interdependency patterns and relations among the dimensioning scenarios and loads-design domain robust solutions and, thus, identify and generate the desired/required AD function robust input (i.e., AD system design parameters)-output (i.e., AD function decision and control parameters) Sense-Act-interdependency relations knowledge-based map; wherein the AD function general robust Sense-Act-interdependency relations map is utilized as a Sense-Act-decision making look-up table implemented the desired robust Sense-Act general AD function in the AD system includes individual general robust solution input-output (I/O)-interdependency relation parameters values combinations plotted against/determined out of the full AD system input-output (I/O)-parameters varying full ranges in a Sense-Act-decision making look-up table implemented the desired robust Sense-Act general AD function in the AD system.

BRIEF DESCRIPTION OF THE DRAWINGS

The present disclosure is illustrated and described herein with reference to the various drawings, in which like reference numbers are used to denote like system components/method steps, as appropriate, and in which:

FIG. 10 is a block diagram of a server which may be used in the cloud-based system of FIG. 9 or the like; and FIG. 11 is a block diagram of a user device which may be used in the cloud-based system of FIG. 9 or the like.

DESCRIPTION OF EMBODIMENTS

Figure 1:
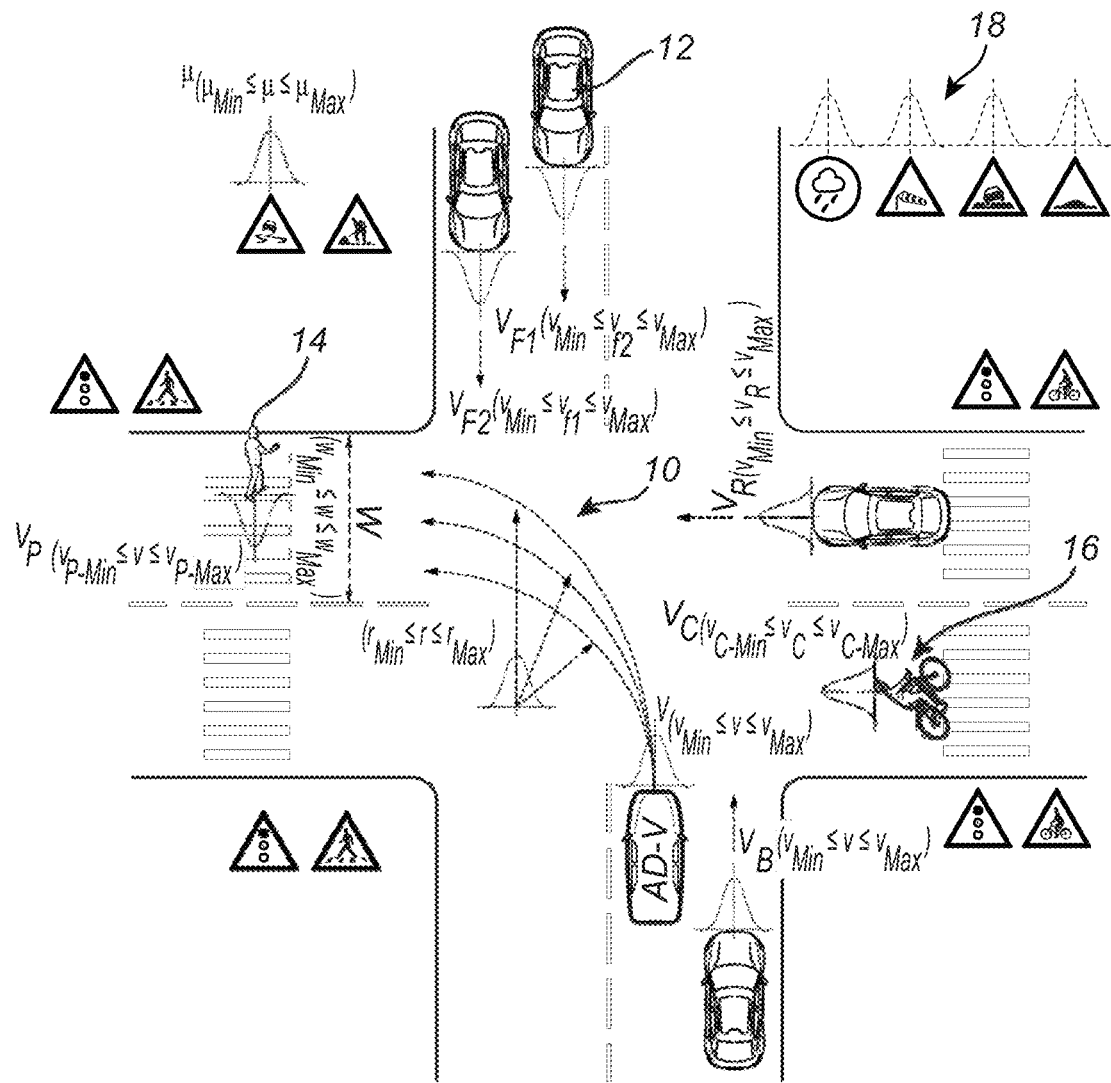
FIG. 1 is a schematic diagram illustrating a number of AD loads and their parameters (with varying ranges and interaction combinations, each with specific noises) that may be confronted by an AD system and, thus via statistics, potentially leading to an N×N× . . . N-exponential problem.

Again, the present disclosure provides a generally valid Sense-Act-AD design that robustly and safely handles a multitude of vehicle systems, in a multitude of operational domains, and with a multitude of operational loads, just as a human driver does. This provides a robustness of AD capability, availability, and safety across the five AD stages of FIG. 2. As illustrated conceptually in FIG. 1, the number of load cases present can lead to an N×N× . . . × N-exponential problem due to the huge number of involved design parameters, with varying ranges and interactions combinations, each with specific noises (as schematically highlighted in the figure) to be handled over time, rendering a solution virtually unachievable and difficult to verify and validate theoretically, experimentally, and in real life. Exemplary loads include, but are certainly not limited to, the motion and status of the ego vehicle 10, the motions of other vehicles 12, the motions of pedestrians 14, the motions of cyclists 16, and operation domain loads such as a multitude of road signs 18, its geometry data (e.g., width, curvature, lanes, and crossings), and its physical condition (e.g., road friction, rain, wind and lighting). Thus, there are an almost infinite number of inputs parameters combinations each with specific noises that an AD system must robustly and safely deals with.

Figure 2:
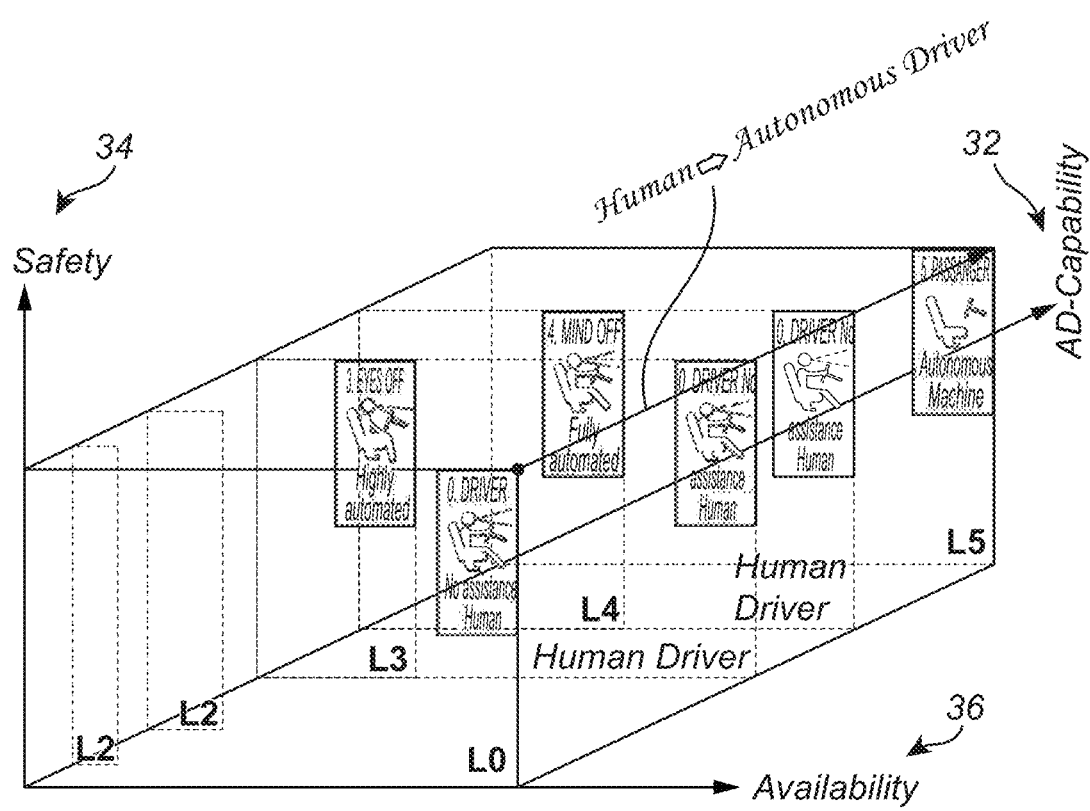
FIG. 2 is a plot illustrating the interplay of AD capability, availability, and safety across the five AD stages.

Referring specifically to FIG. 2, what is desired and essential to achieve is a robustness of AD capability, availability, and safety across the five AD stages as, e.g., required by ISO PAS 21448 (SOTIF) and ISO 26262 (ASIL) standards. The five AD stages (beyond the unassisted human driver, L0 20) include: L1 22—vehicle-assisted human driver (no feet); L2 24—partially automated vehicle-assisted human driver (no feet, no hands); L3 26—highly automated vehicle-assisted human driver (no feet, no hands, no eyes); L4 28—fully-automated vehicle (no feet, no hands, no eyes, no mind); and L5 30—AD vehicle (vehicle occupant is only a passenger, i.e., no human intervention is required in all vehicle operational domain conditions). Moving up the levels, responsibility is progressively transferred from the human to the machine, with decreasing human monitoring and intervention. As is illustrated, at any level of AD capability 32, it is essential to maintain the highest possible degree of vehicle safety 34 and its service robust availability 36. L5 30 represents full autonomy in all environmental conditions.

The objectives and constraints present are AD capability (as a function of AD level and its context, i.e., operational domain), availability (i.e., robustness and SOTIF), and safety (SOTIF and ASIL). The AD vehicle's use and load cases design parameters include, but are not limited to, propulsion, braking, and steering torques, normal driving load scenarios (e.g., lane keeping, lane changes, etc.), critical driving load scenarios (e.g., failure modes, collision mitigation and avoidance, safe stops, fail-safe management, etc.), post-crash management and considerations, etc. The AD system's design parameters include, but are not limited to, vehicle-related mass, mass distribution, actuators (tires, tires pressure, suspension, propulsion, braking, steering, cleaning, etc.), sensors (cameras, radar, LIDAR, etc.), processors, data and algorithm processing, computer security (firewalls, cyber security, etc.), power supplies, and cloud-related online data streaming, logging, and storage, and computer security (firewalls, cyber security, etc.), etc. The AD system's context design parameters include, but are not limited to, traffic loads (vehicles, pedestrians, cyclists, speeds, directions, etc.), road geometry (width, curvature, lanes, crossings, etc.), road data (speeds, traffic light, speed bumps, lanes' marks, etc.), and road loads (friction, wind, potholes, hydroplaning, light, rain, dirt, etc.).

Figure 3:
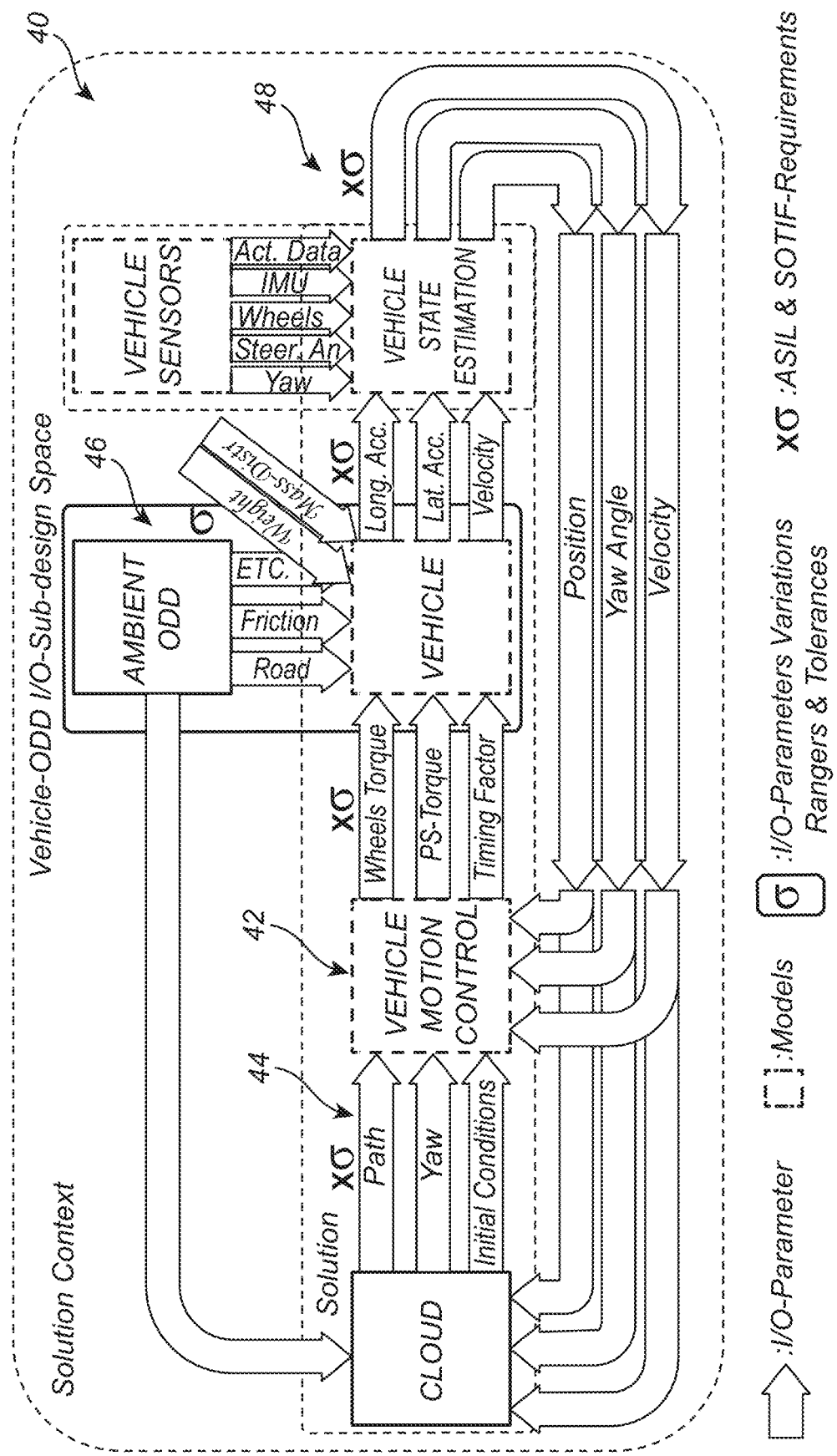
FIG. 3 is a schematic diagram illustrating an autonomous vehicle (AV) control strategy in an AD mode and an AD mode context as a full generally valid AD function full general design space in which the general robust solution of the present disclosure is provided.

FIG. 3 is a schematic diagram illustrating the AV control strategy 40 in AD mode and AD mode context as a full generally valid AD function full general design space in which the general robust solution of the present disclosure is provided, highlighting the various models 42 utilized, the input/output parameters 44, the input/output parameter variations ranges, noises, and tolerances 46, and the associated ASIL and SOTIF requirements 48. The models 42 include, for example, Vehicle Motion Control-, Vehicle-, Vehicle Sensors-, and Vehicle State Estimation-models. The input/output parameters 44 include, for example, Ambient ODD-, Cloud, Vehicle Motion Control-, Vehicle-, and Vehicle Sensors-input/output design parameters. The input/output parameter variations ranges, noises, and tolerances 46 include, for example, Road-, Friction-, Weight-, Mass-Distribution-, Yaw-, Steering Angle-, Wheel Sensor-, and IMU-parameters variations ranges, noises, and tolerances. The ASIL and SOTIF requirements 48 include, for example, tolerances- and standard deviation sigma-requirements on Path-, Yaw-, Initial Conditions-, Wheels Torque-, Power Steering- Torque-, Timing Factor-, Longitudinal Acceleration-, Lateral Acceleration-, Velocity-, and Position-tolerated deviations by ASIL and SOTIF requirements.

Due to the AD system's multitude of vehicle systems, multitude of operational domains, and multitude of operational loads, and, thus, the huge number of the full system design parameters, with varying ranges, and interactions combinations, each with specific noises to be handled over time, there are almost an infinite number of nominal load cases, each with specific noises, that must be robustly and safely considered and managed in implementing a noises tolerant and fail-safe AD system. This problem is effectively undefinable and, thus, essentially unsolvable using existing experimental (i.e., big data) and/or analytical methods.

Thus, an analytical statistical approach, with the unconditional needed precision, to efficiently handle the joint "AD-driver-vehicle-operational domain" general problem definition formulation/generation while aiming for its general robust solutions, rather than the unique ones, is provided. Computer Aided Engineering (CAE), Design of Experiments (DOE), meta-modelling, full general multi-dimensional design space problem definition creation, multi-objective design for six sigma (MODFSS), and data mining approaches are combined and fully utilized. This provides the full generally valid AD-problem definition and extracts the needed knowledge of the full general AD system robust interdependency input-output (I/O)-relations, while considering the capability, availability, and safety of the AD function and lays a foundation for a general robust AD function capabilities map/look-up table as the general robust solutions of the full general AD-problem definition, which is the characterization and qualification tool of the present disclosure.

Figure 4:
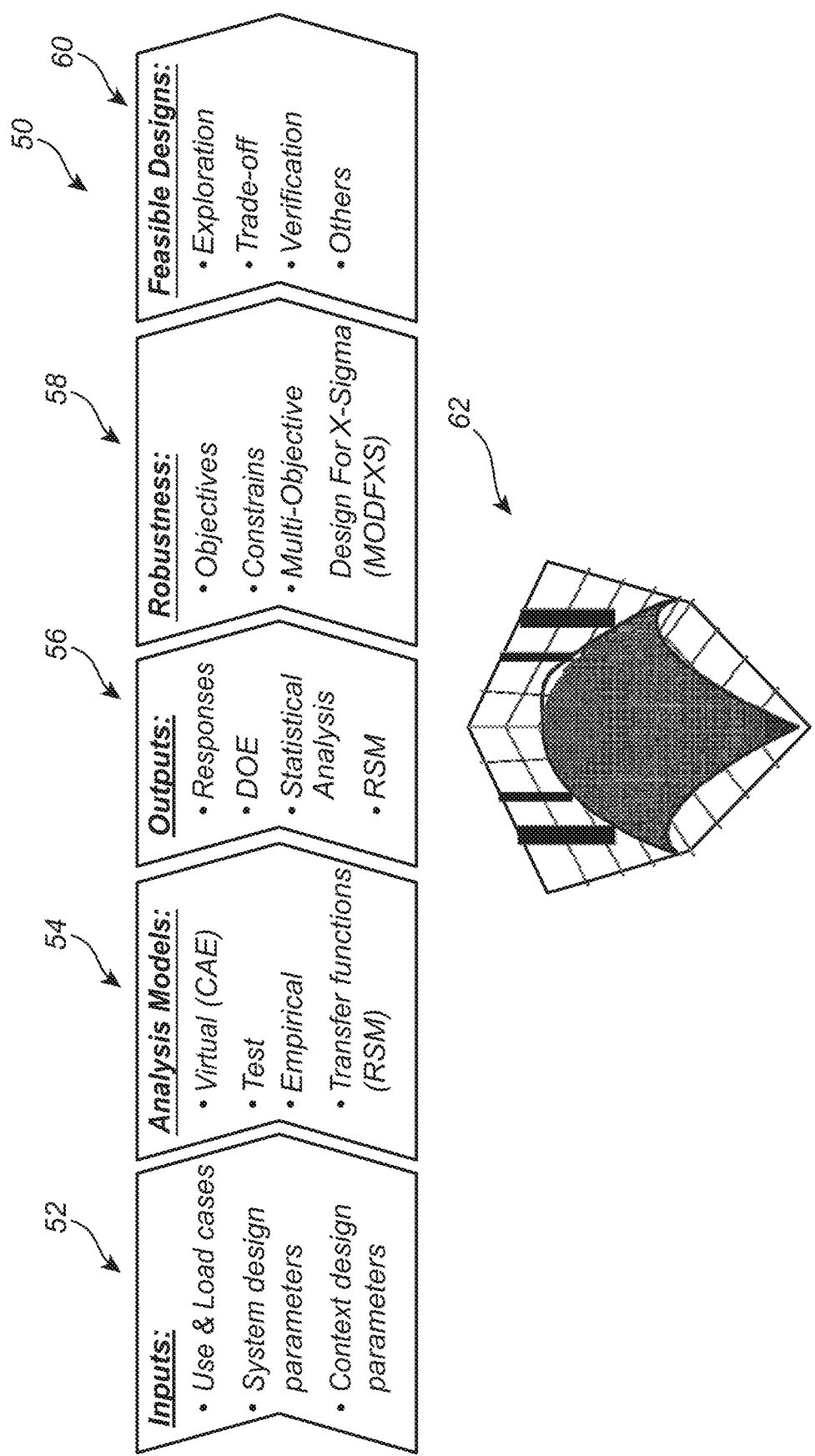
FIG. 4 is a schematic diagram illustrating one exemplary embodiment of the robust AD design high level approach of the present disclosure.
Figure 5:
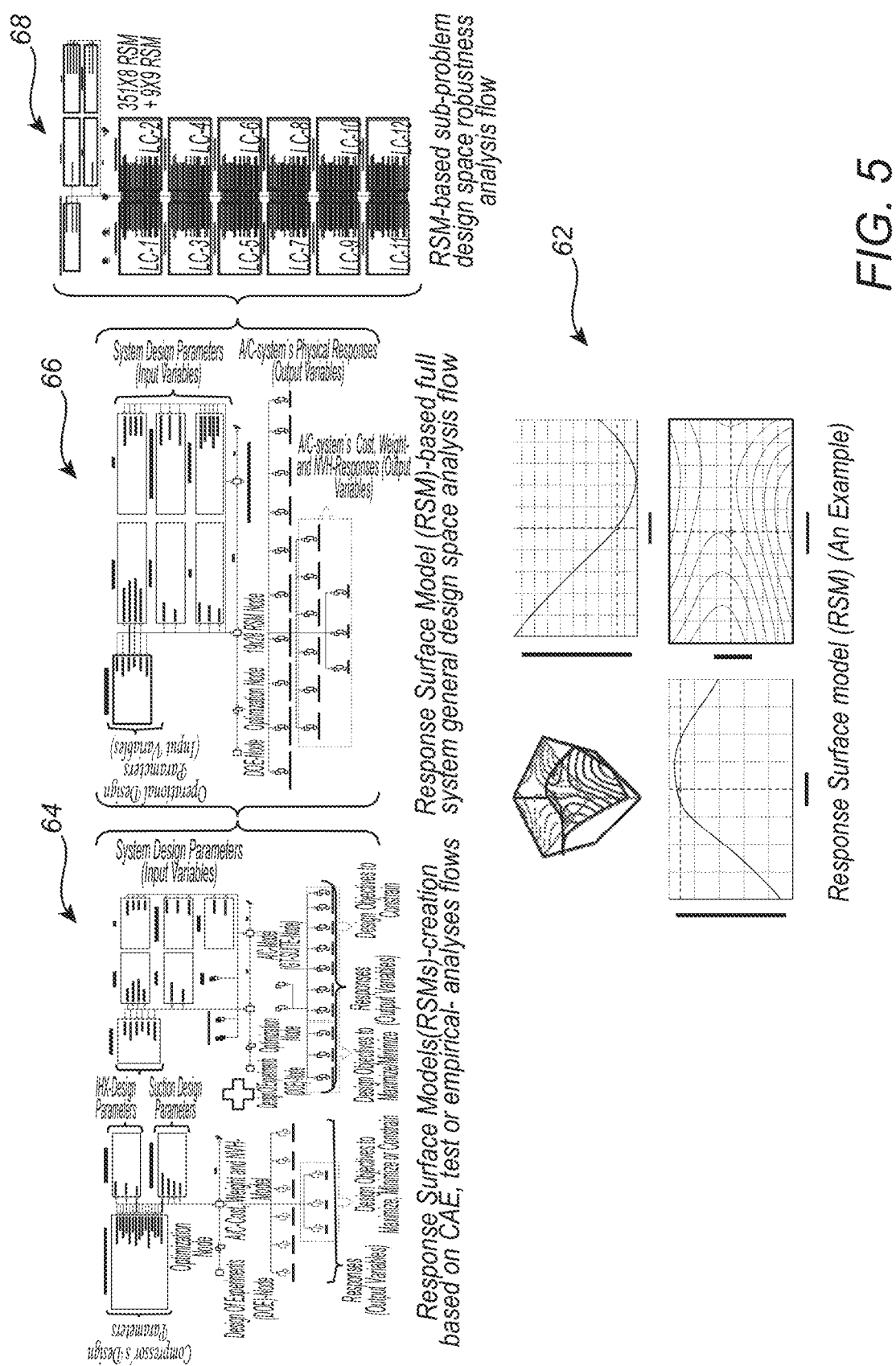
FIG. 5 is another schematic diagram illustrating one exemplary embodiment of the design approach that is be applied to the general robust AD design of the present disclosure.

As illustrated in FIGS. 4 and 5, the analytical statistical approach 50 of the present disclosure includes providing inputs 52 to a plurality of analysis models 54 to generate outputs 56. These inputs 52 include use and load cases, system design parameters, and system context design parameters, while the models 54 include virtual (i.e., CAE) models, test-based models, empirical models, and transfer functions. The outputs 56 include responses and design of experiments (DOEs) to be used for statistical analyses, and response surface models (RSMs) 62 (i.e., transfer functions) creation. The outputs 56 are constrained for robustness 58, including objectives, constraints, and multi-objective design for X sigma (MODFXS), for example. Feasible AD system robust designs 60 are then explored for trade-offs, verifications, and the like. For example, FIG. 5 illustrates the use of CAE- or test-based- or empirical-models in different sub-design spaces input-output (I/O)-analysis flows to generate their different RSMs to be, thereafter, combined into a full-system design space RSM-based input-output (I/O)-analysis flow. Here, the CAE- or test-based- or empirical-model's different sub-design spaces-based analysis flows' generated RSMs 64 are converted to a general problem RSM-based full-system design space analysis flow 66 to be used to provide different desired specific sub-problems RSM-based analysis flows where objectives and constraints are applied for the sub-problem RSM-based robustness analysis flow 68.

Figure 6:
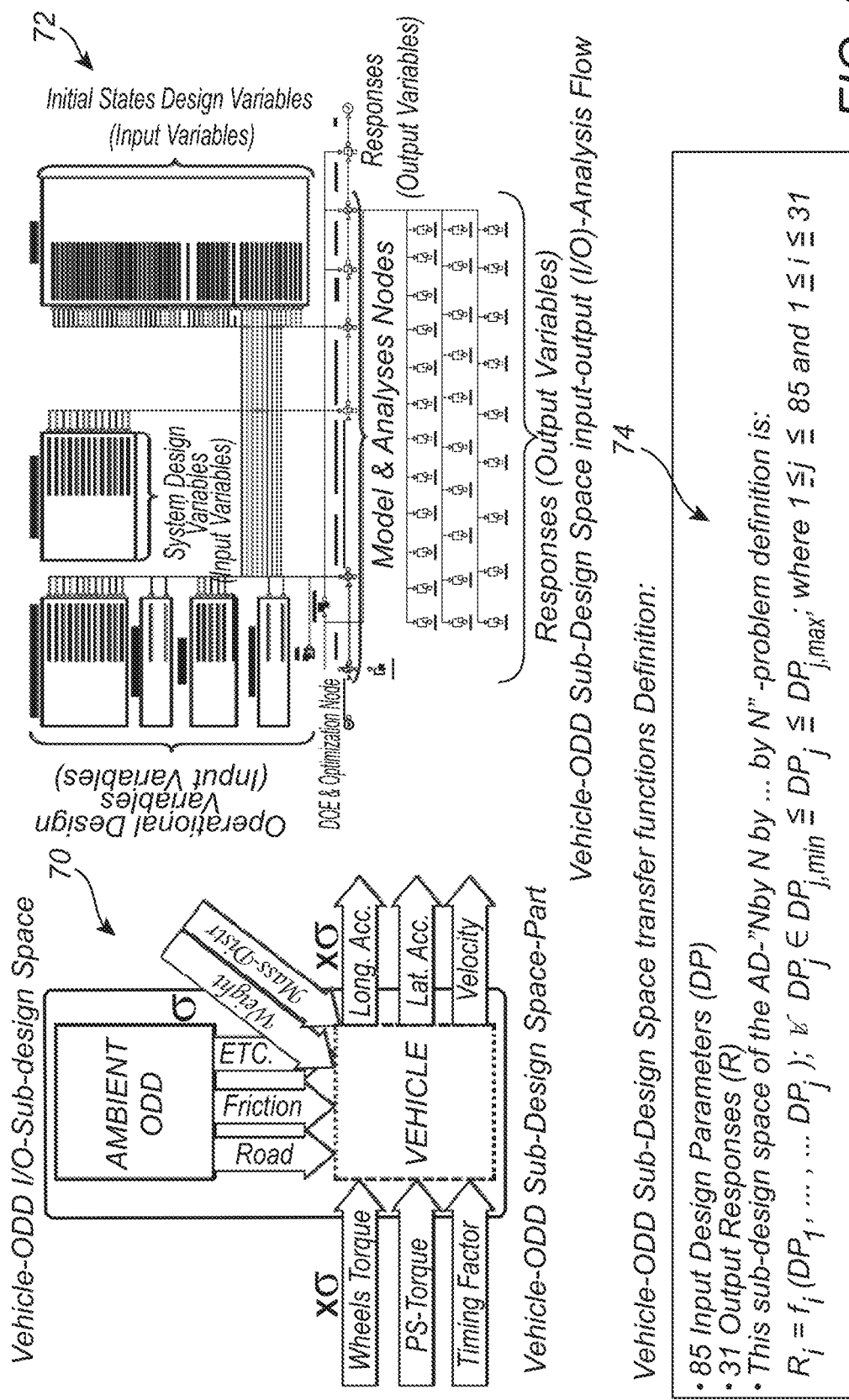
FIG. 6 is a schematic diagram illustrating one exemplary embodiment of the full design space partition approach that is applied to the general AD design of the present disclosure, where the AV-model and its ODD-I/O sub-design space-part of the general AD function full design space, its input-output (I/O)-analysis flow, and its transfer functions definition are schematically illustrated.

FIG. 6 is a schematic diagram illustrating the autonomous vehicle (AV)-model and its operational design domain (ODD)-input-output (I/O) sub-design space-part 70 of the general AD function full design space (see FIG. 3), the autonomous vehicle (AV)-model and its operational design domain (ODD)-input-output (I/O) sub-design space-part analysis flow 72, and the autonomous vehicle (AV)-model and its operational design domain (ODD)-input-output (I/O) sub-design space-part transfer functions definition 74.

Creating the plurality of transfer functions for the plurality of the different parts of the full generally valid AD function full general design space includes Design Of Experiment (DOE)-based regression models creation that, each, relates the specific part sub-design space's output responses (i.e., the sub-design space part output parameters), each, to its all input design parameters (i.e., the sub-design space part input parameters). Where the sub-design space part's transfer functions f for each of its output responses R can be defined as follows:

$$R_i = f_i(DP_1, \ldots, \ldots, DP_j) : \forall DP_j \in DP_{j,min} \leq DP_j \leq DP_{j,max}; \text{ where } 1 \leq j \leq N \text{ and } 1 \leq i \leq M$$

where:
DP is an input design parameter,
R is an output design parameter,
N is the number of the input design parameter (DP), and
M is the number of the output design parameter (R).

FIGS. 3 and 6 show a schematic presentation of the autonomous vehicle (AV)-model and its operational design domain (ODD)-part's input-output (I/O) sub-design space 70 highlighted as a sub-design space part of the full generally valid AD function full general design space 40 of FIG. 3. FIG. 6 illustrates this sub-design space part input-output (I/O)-analysis flow 72 and its transfer functions definition 74, with its 85 input design parameters and 31 output design responses, to be used to create its 31 transfer functions, as an example of FIG. 3 general AD-function full design space 40 partition. Combining the plurality of transfer functions of the different parts generates the general AD function full multi-dimensional design space and its input-output (I/O)-analysis flow (see FIG. 5 as an example of combining sub-design spaces into a full general one 66) includes the autonomous vehicle, its operational domain, its sensors, its state estimation, and its motion control as a full general design space analysis flow that is equivalent to the full general AD function closed loop control 40 in FIG. 3 and extends over all feasible different AD function dimensioning scenarios and loads. Defining the plurality of the desired/required AD function different dimensioning scenarios and loads to obtain their related AD function sub-problem specific sub-design space input-output (I/O)-analysis flow (see FIG. 5 where an example of extracting a specific sub-design space analysis flow 68 from the full general one 66 is shown) includes the creation of the sub-transfer functions of the dimensioning scenarios and loads-desired AD function sub-design space analysis flow utilizing the full general AD function multi-dimensional design space analysis flow one where continuous and/or discrete sub-design space input parameters can be considered. Incorporating the robustness demands by applying the plurality of different sigma targets to the objectives and constraints of the dimensioning scenarios and loads-AD function problem analysis flow to identify the plurality of the dimensioning scenarios and loads-design domain robust solutions includes considering the desired AD function insensitive tolerant performance towards its input design parameters different specific noises and tolerances, to be all, simultaneously, considered while looking for the desired AD function reliable robust performance. Applying the one or more of weighed optimization and data mining to rank and extract the interdependency patterns and relations among the dimensioning scenarios and loads-design domain robust solutions and, thus, identify and generate the desired AD function Sense-Act-interdependency relations knowledge-based map includes applying Multi Criteria Decision Making (MCDM)-weighed optimization to rank in-between the robust solutions, as well as data mining based, e.g., on Computer Aided Principle (CAP)-data clustering and Self Organizing Maps (SOM) to identify interdependencies patterns among robust solutions. The AD function general robust interdependencies relations map is utilized as a Sense-Act-decision making look-up table implemented the desired robust Sense-Act general AD function in the AD system includes individual general robust solution input-output (I/O)-interdependency relation parameters values combinations (that determinate the system robust decision and control-responses/actions as a function of its input design parameters variations and interactions within their full varying ranges while considering their different specific noises and tolerances) are plotted against/determined out of the full AD system input-output (I/O)-parameters varying full ranges in a Sense-Act-decision making look-up table to be used to implement the desired robust Sense-Act general AD function in the AD system.

Figure 7:
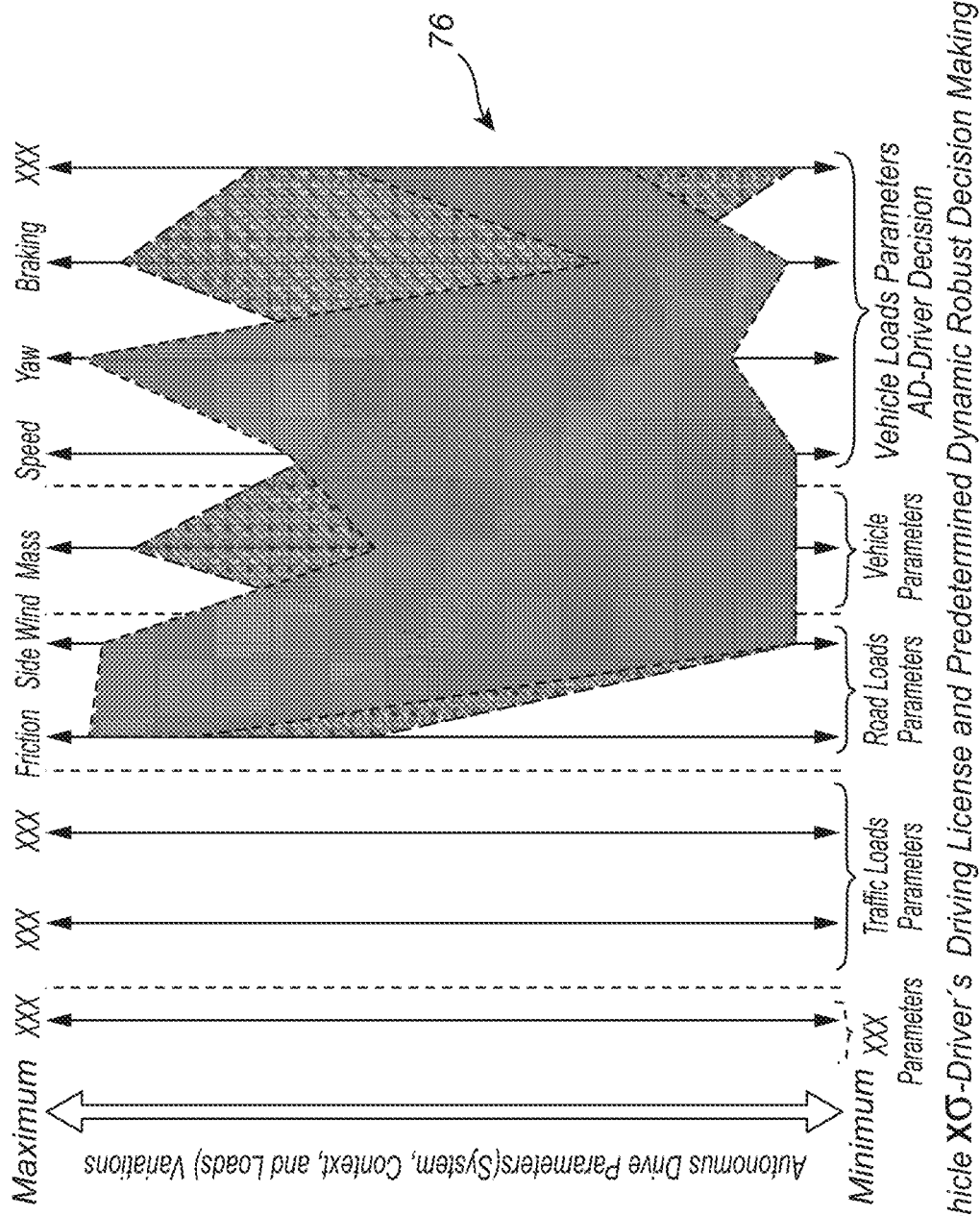
FIG. 7 is a plot illustrating the resulting AD function Sense-Act decision making map/look-up table of the general robust AD design of the present disclosure, where the individual general robust solutions I/O-interdependencies relations parameters values combinations are plotted against the full AD system I/O-parameters full ranges.

FIG. 7 is a plot illustrating the resulting AD function robust Sense-Act-decision making map/look-up table 76 of the general robust AD design of the present disclosure, which represents the analytical statistical design approach outcome that makes it feasible to robustly and safely replace the human driver with the autonomous driver. Here, the AD function general robust solutions' input-output (I/O)-interdependencies relations all parameters values are plotted against the full AD system's input-output (I/O)-parameters full ranges, as a predetermined general robust Sense-Act-AD function decision and control capabilities allowing the system to make fast robust decisions with global situation awareness. Thus, the AD system can now efficiently perform robust data processing, with sensor fusion, different sensors fusion scenarios, intuitiveness/instinctiveness, attention/alertness, evasiveness, analysis, efficiency, etc., as the human driver does. The AD system can also now implement efficient, robust, safe decision making processes, with closed-loop control, and robust noises, systems' degradation (e.g., sensor or/and actuator degradation), and fail-safe management. All of these things are achieved without the need for large and complex code that would be difficult, bug-sensitive, and both time- and resources-consuming to develop, execute, and manage". Thus, the "human driver-vehicle-operational domain"-system is effectively replaced with an "autonomous driver-vehicle-operational domain"-system owing to the predetermined general robust Sense-Act-AD function decision making capabilities map/look-up table 76 creation. No high CPU-time-demanding computations are performed in the vehicle, with the general robust Sense-Act-AD-map/look-up table 76 now being predetermined and locally preloaded in AD-vehicle's AD-processor, providing the robust AD-function general Sense-Act decision making solutions. A good analogy for the engine of the present disclosure is the way the human olfactory system evolutionary predeveloped Sense-Act response/reaction works.

Figure 8:
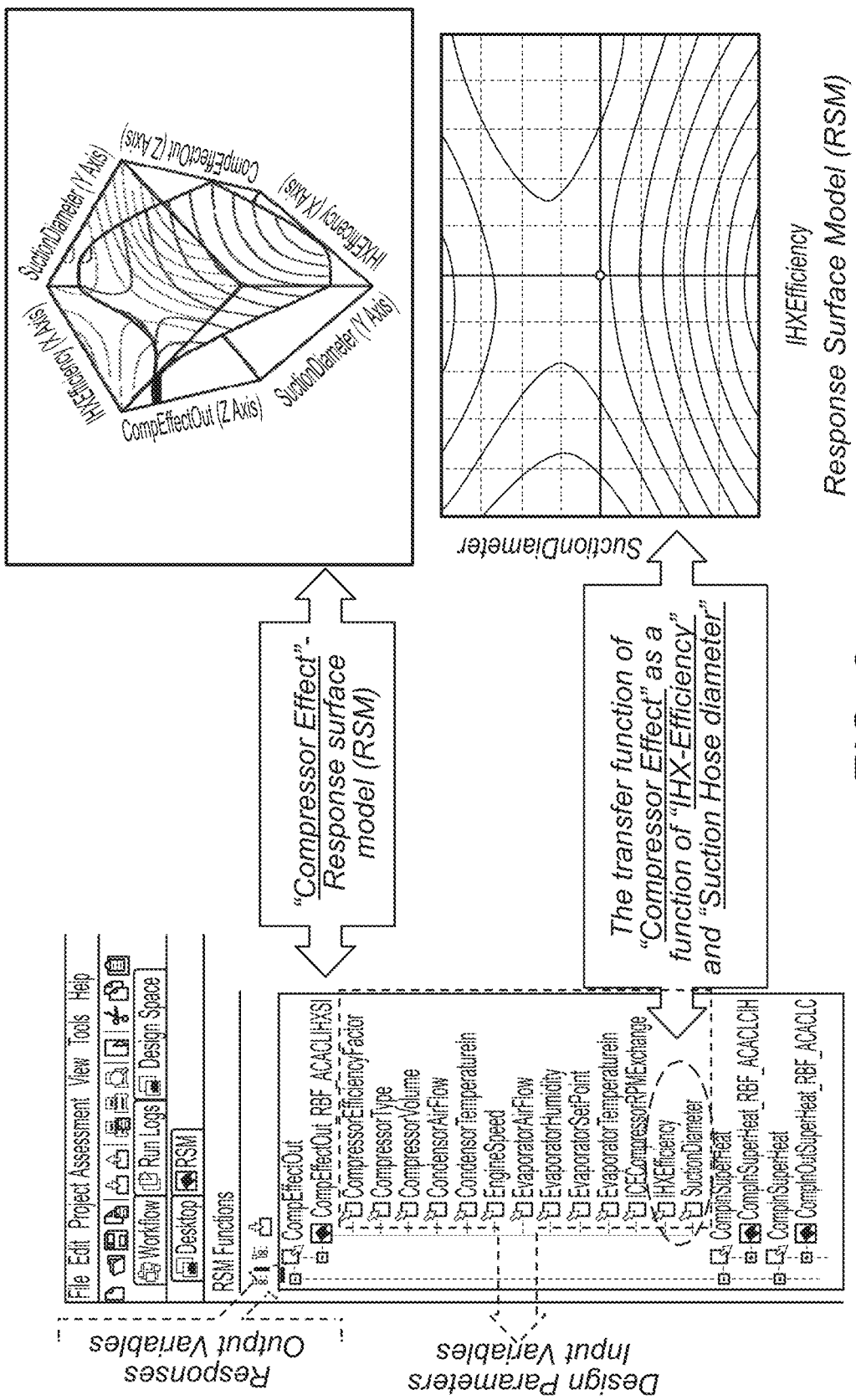
FIG. 8 is a schematic diagram illustrating the operation of a meta-model/response surface model (RSM) like the ones that are utilized by the robust AD design of the present disclosure.

As illustrated in FIG. 8, as used herein, a meta-model or RSM is a DOE-based regression model or a transfer function that relates a system response (i.e., a system's output parameter) to all its design parameters (i.e., the system's input parameters). A "compressor effect"-RSM example is provided.

The AD-function analytical statistical design approach of the present disclosure broadly implements the following steps:

1. Creating transfer functions for the different parts of the full generally valid AD function full general design space; includes Design Of Experiment (DOE)-based regression models creation that, each, relates the specific part sub-design space output responses (i.e., the sub-design space part output parameters), each, to its all input design parameters (i.e., the sub-design space part input parameters). For a specific part of the general AD-function full design space, see, e.g., FIGS. 3 and 6 where a schematic presentation of the autonomous vehicle (AV)-model and its operational design domain (ODD)-part's input-output (I/O) sub-design space is highlighted by a dark red full line rectangular. FIG. 6 illustrates this specific part sub-design space input-output (I/O)-analysis flow and its transfer functions definition, with its 85 input design parameters and 31 output design responses, to be used to create its 31 transfer functions, as an example of FIG. 3 general AD-function full design space partition. FIG. 5 shows the use of different type of models in different full design space parts' sub-design spaces input-output (I/O)-analysis flows to generate their different RSMs 64.

2. Combining the different full design space partition parts' transfer functions (of step 1) into one full general AD function multi-dimensional design spaces and its full general input-output (I/O)-analysis flow, (see FIG. 5); includes the autonomous vehicle, its operational domain, its sensors, its state estimation, and its motion control as a full general design space analysis flow that is equivalent to the full general AD function closed loop control in FIG. 3 and extends over all feasible different AD function dimensioning scenarios and loads. FIG. 5 shows an example of combining sub-design spaces analysis flows into a full general one 66.

3. Defining the desired AD function different dimensioning scenarios and loads to obtain their related AD function sub-problem specific sub-design space input-output (I/O)-analysis flow; includes the creation of the sub-transfer functions of the dimensioning scenarios and loads desired AD function sub-design space analysis flow utilizing the full general AD function multi-dimensional design space analysis flow one (of step 2) where continuous and/or discrete sub-design space input parameters can be considered. FIG. 5 shows an example of extracting a specific sub-design space analysis flow from the full general one 68.

4. Incorporating robustness demands by applying different sigma targets to the objectives and constraints of the dimensioning scenarios and loads-AD function problem analysis flow (of step 3) to identify its design domain robust solutions; includes considering the desired AD function insensitive tolerant performance towards its input design parameters different specific noises and tolerances, to be all, simultaneously, considered while looking for the desired AD function reliable robust performance. FIG. 5 shows an example of a specific sub-design space analysis flow including robustness objectives 68.

5. Applying weighed optimization and/or data mining to rank and extract the interdependency patterns and relations among the robust solutions data (of step 4), hence the required AD function robust interdependency relations knowledge-based Sense-Act map/look-up table 76 provided in FIG. 7; includes applying Multi Criteria Decision Making (MCDM)-weighed optimization to rank in-between the robust solutions, as well as data mining based, e.g., on Computer Aided Principle (CAP)-data clustering and Self Organizing Maps (SOM) to identify interdependencies patterns among the robust solutions, and, thus, generate the desired general AD function robust interdependency relations map (see FIG. 7, 76) to be utilized as a Sense-Act-decision making look-up table that used to implement the desired robust Sense-Act general AD function in the AD system.

6. Verifying final designs of the robust Sense-Act-decision making look-up table of the general AD function (of step 5) theoretically and experimentally.

The above described AD-function analytical statistical design approach of the present disclosure makes it feasible to handle the large, complex, undefinable and, thus, unsolvable joint "AD-driver-vehicle-operational domain" general problem (i.e., N×N× . . . × N-exponential problem) by partition of its full general multi-dimensional design space, generation of sub-design spaces' transfer functions, reassembling the sub-design spaces' transfer functions into one full generally valid AD function full general design space leading to the AD function general problem definition generation and its input-output (I/O)-analysis flow, extracting any desired/required AD function specific problem definition as a sub-design space analysis flow from the full general AD function problem definition design space analysis flow, applying robustness sigma requirements to the specific AD-function design space analysis flow output responses' objectives and constraints to obtain its reliable robust solutions as the desired AD function general solutions while considering the capability, availability, and safety of the AD-system as required, e.g., by ISO PAS 21448 (SOTIF)- and ISO 26262 (ASIL)-standards, and, finally, utilizing weighed optimization and data mining to extract the required AD function specific interdependency relations knowledge among its reliable robust solutions to be stored in a Sense-Act decision making look-up table instruction that provides the desired available safe AD function general capabilities to be implemented locally in AD-vehicle in a memory and executed by, in AD vehicle, AD-processor providing the unconditional necessary precision to efficiently handle the joint "ADdriver-vehicle-operational domain"-system when replacing the human driver with an autonomous one.

The successfully verified AD function general robust input-output-interdependency relations-based Sense-Act-decision making look-up table of the predetermined full generally valid AD function is the objective of the utilized analytical statistical AD-function design approach of the present disclosure. It makes it feasible to robustly and safely replace the human driver with an equivalent or better worldwide generally valid Sense-Act-agile general robust autonomous driver function owing to it (i.e. the general robust decision making Sense-Act look-up table) as a worldwide generally valid autonomous driving license likewise a worldwide human driver's driving license. This is achieved without the need for a large and complex code or high CPU-time-demanding computations to be locally performed in the AD-vehicle with, among other things, both data processing- and response time-high agility, reduced code bugs and failures management, needed processors capacity, and online update and upgrade time of the AD-function look-up table, and improved security. The general robust AD-function Sense-Act decision making look-up table of the present disclosure is locally preloaded and installed in the autonomous vehicle in a memory and executed by, in AD vehicle, AD-processor, limiting the AD-system real-time cloud connectivity and communication dependency, especially when dealing with safety critical data. This is in analogy with the "human driver-vehicle-operational domain"-closed loop control system, as the human driver is located in the loop and, thus, there is no need of online cloud connectivity and communication to performed robust and safe driving. Online, non-real-time dependent safety uncritical data, e.g., AD-function Sense-Act decision making look-up updates and upgrades as well as convenience real-time data (e.g. Car2Car-data sharing) are managed though cloud connectivity. Together with AD vehicle's AD-processor redundancy (i.e. AD-vehicle multiple central AD-processors), the AD-function general robust Sense-Act-decision making look-up table's local preloaded installation in each one of AD-processors memories will highly improve the AD-system robustness, safety, cyber security as well as degradation and fault management. In combination with a suitable autonomous driving kit (i.e., sensors, actuators redundancy, AD-processor, etc.), this AD function general robust Sense-Act-decision making look-up table is also vehicle independent, i.e., in other words, is applicable to any road vehicle to transform it to an AD-one.

The present disclosure enables, for example, the certification of an AD driver's different driving license via their related AD-capabilities level, purpose, profile and context (e.g., operational domain (OD))-maps/look-up tables 76 based on AD-vehicle's sensors inputs. No high CPU-time-demanding computations are performed in the vehicle, with the general robust Sense-Act-decision making look-up table of the general AD function, i.e. the maps/look-up tables 76, now being predeveloped and predetermined, and locally preloaded in AD-vehicle, and a general robust solution has now been provided, as opposed to the unique sensitive ones. There is now an ability to generally handle different versions of problems and their related solutions with an intuitive Sense-Act-adaptability. AD maps/look-up tables 76 can be provided, updated and upgraded over-the air and on-demand, customizable to different AD levels, capabilities, regions, vehicles, contexts, purpose, profile, etc. Utilizing the general AD-function Sense-Act decision making look-up table of the present disclosure different sensor fusion- and sensor and actuator degradation scenarios-concepts are pre-designed, predeveloped, predetermined and preloaded locally in AD-vehicle in a memory and executed by, in AD vehicle, AD-processor, and can now be handled, with real-time mode shifts.

It is to be recognized that, depending on the example, certain acts or events of any of the techniques described herein can be performed in a different sequence, may be added, merged, or left out altogether (e.g., not all described acts or events are necessary for the practice of the techniques). Moreover, in certain examples, acts or events may be performed concurrently, e.g., through multi-threaded processing, interrupt processing, or multiple processors, rather than sequentially.

Figure 9:
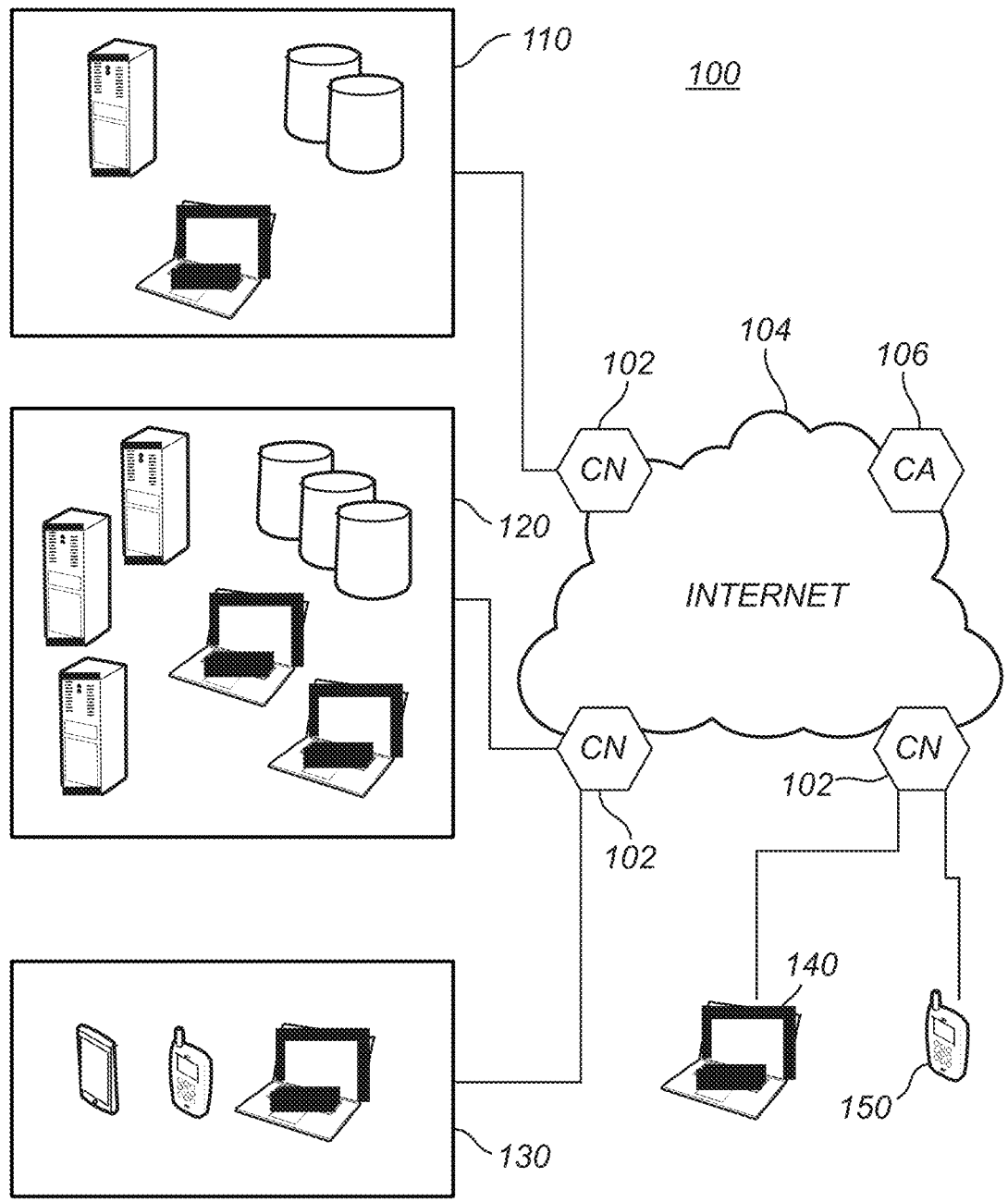
FIG. 9 is a network diagram of a cloud-based system for implementing various cloud-based methodologies of the present disclosure.
Figure 10:
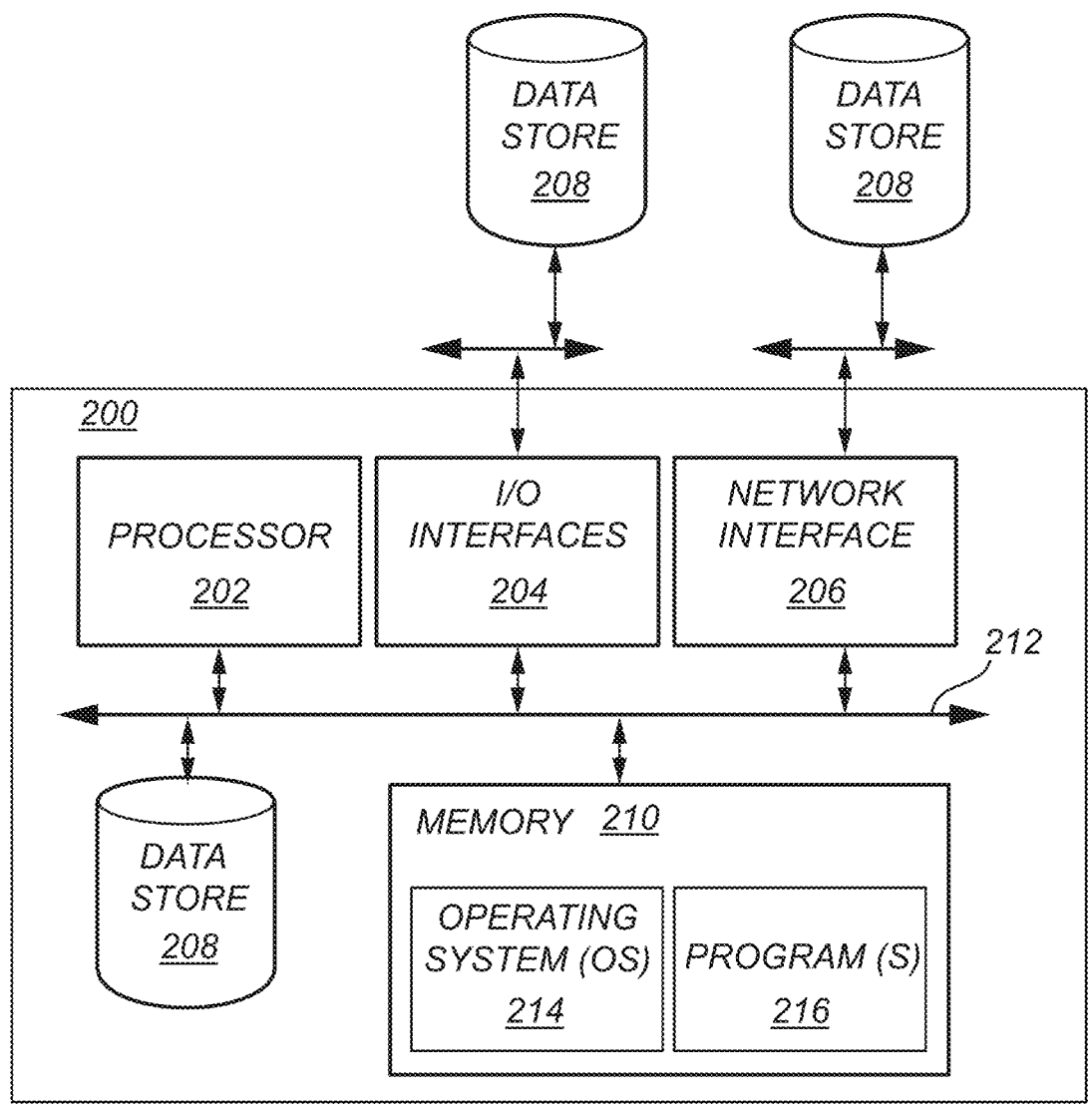

FIG. 9 is a network diagram of a cloud-based system 100 for implementing various cloud-based services of the present disclosure. The cloud-based system 100 includes one or more cloud nodes (CNs) 102 communicatively coupled to the Internet 104 or the like. The cloud nodes 102 may be implemented as a server 200 (as illustrated in FIG. 10) or the like and can be geographically diverse from one another, such as located at various data centers around the country or globe. Further, the cloud-based system 100 can include one or more central authority (CA) nodes 106, which similarly can be implemented as the server 200 (see FIG. 10) and be connected to the CNs 102. For illustration purposes, the cloud-based system 100 can connect to a regional office 110, headquarters 120, various employee's homes 130, laptops/desktops 140, and mobile devices 150, each of which can be communicatively coupled to one of the CNs 102. These locations 110, 120, and 130, and devices 140 and 150 are shown for illustrative purposes, and those skilled in the art will recognize there are various access scenarios to the cloud-based system 100, all of which are contemplated herein. The devices 140 and 150 can be so-called road warriors, i.e., users off-site, on-the-road, etc. The cloud-based system 100 can be a private cloud, a public cloud, a combination of a private cloud and a public cloud (hybrid cloud), or the like.

Again, the cloud-based system 100 can provide any functionality through services such as software-as-a-service (SaaS), platform-as-a-service, infrastructure-as-a-service, security-as-a-service, Virtual Network Functions (VNFs) in a Network Functions Virtualization (NFV) Infrastructure (NFVI), etc. to the locations 110, 120, and 130 and devices 140 and 150. Previously, the Information Technology (IT) deployment model included enterprise resources and applications stored within an enterprise network (i.e., physical devices), behind a firewall, accessible by employees on site or remote via Virtual Private Networks (VPNs), etc. The cloud-based system 100 is replacing the conventional deployment model. The cloud-based system 100 can be used to implement these services in the cloud without requiring the physical devices and management thereof by enterprise IT administrators.

Cloud computing systems and methods abstract away physical servers, storage, networking, etc., and instead offer these as on-demand and elastic resources. The National Institute of Standards and Technology (NIST) provides a concise and specific definition which states cloud computing is a model for enabling convenient, on-demand network access to a shared pool of configurable computing resources (e.g., networks, servers, storage, applications, and services) that can be rapidly provisioned and released with minimal management effort or service provider interaction. Cloud computing differs from the classic client-server model by providing applications from a server that are executed and managed by a client's web browser or the like, with no installed client version of an application required. Centralization gives cloud service providers complete control over the versions of the browser-based and other applications provided to clients, which removes the need for version upgrades or license management on individual client computing devices. The phrase "software as a service" (SaaS) is sometimes used to describe application programs offered through cloud computing. A common shorthand for a provided cloud computing service (or even an aggregation of all existing cloud services) is "the cloud." The cloud-based system 100 is illustrated herein as one example embodiment of a cloud-based system, and those of ordinary skill in the art will recognize the systems and methods described herein are not necessarily limited thereby.

FIG. 10 is a block diagram of a server 200, which may be used in the cloud-based system 100 (FIG. 9), in other systems, or standalone. For example, the CNs 102 (FIG. 9) and the central authority nodes 106 (FIG. 9) may be formed as one or more of the servers 200. The server 200 may be a digital computer that, in terms of hardware architecture, generally includes a processor 202, input/output (I/O) interfaces 204, a network interface 206, a data store 208, and memory 210. It should be appreciated by those of ordinary skill in the art that FIG. 10 depicts the server 200 in an oversimplified manner, and a practical embodiment may include additional components and suitably configured processing logic to support known or conventional operating features that are not described in detail herein. The components (202, 204, 206, 208, and 210) are communicatively coupled via a local interface 212. The local interface 212 may be, for example, but is not limited to, one or more buses or other wired or wireless connections, as is known in the art. The local interface 212 may have additional elements, which are omitted for simplicity, such as controllers, buffers (caches), drivers, repeaters, and receivers, among many others, to enable communications. Further, the local interface 212 may include address, control, and/or data connections to enable appropriate communications among the aforementioned components.

The processor 202 is a hardware device for executing software instructions. The processor 202 may be any custom made or commercially available processor, a central processing unit (CPU), an auxiliary processor among several processors associated with the server 200, a semiconductor-based microprocessor (in the form of a microchip or chipset), or generally any device for executing software instructions. When the server 200 is in operation, the processor 202 is configured to execute software stored within the memory 210, to communicate data to and from the memory 210, and to generally control operations of the server 200 pursuant to the software instructions. The I/O interfaces 204 may be used to receive user input from and/or for providing system output to one or more devices or components.

The network interface 206 may be used to enable the server 200 to communicate on a network, such as the Internet 104 (FIG. 9). The network interface 206 may include, for example, an Ethernet card or adapter (e.g., 10BaseT, Fast Ethernet, Gigabit Ethernet, or 10GbE) or a Wireless Local Area Network (WLAN) card or adapter (e.g., 802.11a/b/g/n/ac). The network interface 206 may include address, control, and/or data connections to enable appropriate communications on the network. A data store 208 may be used to store data. The data store 208 may include any of volatile memory elements (e.g., random access memory (RAM, such as DRAM, SRAM, SDRAM, and the like)), non-volatile memory elements (e.g., ROM, hard drive, tape, CDROM, and the like), and combinations thereof. Moreover, the data store 208 may incorporate electronic, magnetic, optical, and/or other types of storage media. In one example, the data store 208 may be located internal to the server 200, such as, for example, an internal hard drive connected to the local interface 212 in the server 200. Additionally, in another embodiment, the data store 208 may be located external to the server 200 such as, for example, an external hard drive connected to the I/O interfaces 204 (e.g., a SCSI or USB connection). In a further embodiment, the data store 208 may be connected to the server 200 through a network, such as, for example, a network-attached file server.

The memory 210 may include any of volatile memory elements (e.g., random access memory (RAM, such as DRAM, SRAM, SDRAM, etc.)), non-volatile memory elements (e.g., ROM, hard drive, tape, CDROM, etc.), and combinations thereof. Moreover, the memory 210 may incorporate electronic, magnetic, optical, and/or other types of storage media. Note that the memory 210 may have a distributed architecture, where various components are situated remotely from one another but can be accessed by the processor 202. The software in memory 210 may include one or more software programs, each of which includes an ordered listing of executable instructions for implementing logical functions. The software in the memory 210 includes a suitable operating system (O/S) 214 and one or more programs 216. The operating system 214 essentially controls the execution of other computer programs, such as the one or more programs 216, and provides scheduling, input-output control, file and data management, memory management, and communication control and related services. The one or more programs 216 may be configured to implement the various processes, algorithms, methods, techniques, etc. described herein.

It will be appreciated that some embodiments described herein may include one or more generic or specialized processors ("one or more processors") such as microprocessors; central processing units (CPUs); digital signal processors (DSPs); customized processors such as network processors (NPs) or network processing units (NPUs), graphics processing units (GPUs), or the like; field programmable gate arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more application-specific integrated circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured or adapted to," "logic configured or adapted to," etc. perform a set of operations, steps, methods, processes, algorithms, functions, techniques, etc. on digital and/or analog signals as described herein for the various embodiments.

Moreover, some embodiments may include a non-transitory computer-readable storage medium having computer-readable code stored thereon for programming a computer, server, appliance, device, processor, circuit, etc. each of which may include a processor to perform functions as described and claimed herein. Examples of such computer-readable storage mediums include, but are not limited to, a hard disk, an optical storage device, a magnetic storage device, a Read-Only Memory (ROM), a Programmable Read-Only Memory (PROM), an Erasable Programmable Read-Only Memory (EPROM), an Electrically Erasable Programmable Read-Only Memory (EEPROM), flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Figure 11:
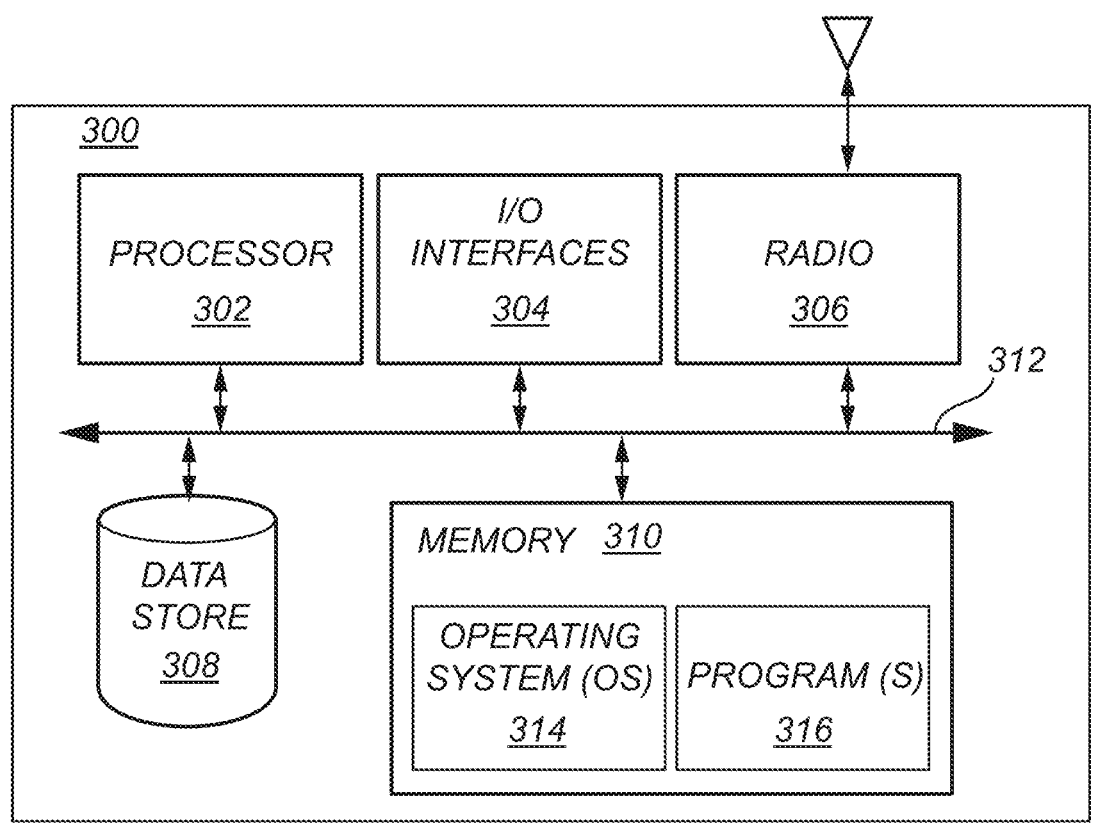

FIG. 11 is a block diagram of a user device 300, which may be used in the cloud-based system 100 (FIG. 9) or the like. Again, the user device 300 can be a smartphone, a tablet, a smartwatch, an Internet of Things (IoT) device, a laptop, a virtual reality (VR) headset, etc. The user device 300 can be a digital device that, in terms of hardware architecture, generally includes a processor 302, I/O interfaces 304, a radio 306, a data store 308, and memory 310. It should be appreciated by those of ordinary skill in the art that FIG. 11 depicts the user device 300 in an oversimplified manner, and a practical embodiment may include additional components and suitably configured processing logic to support known or conventional operating features that are not described in detail herein. The components (302, 304, 306, 308, and 310) are communicatively coupled via a local interface 312. The local interface 312 can be, for example, but is not limited to, one or more buses or other wired or wireless connections, as is known in the art. The local interface 312 can have additional elements, which are omitted for simplicity, such as controllers, buffers (caches), drivers, repeaters, and receivers, among many others, to enable communications. Further, the local interface 312 may include address, control, and/or data connections to enable appropriate communications among the aforementioned components.

The processor 302 is a hardware device for executing software instructions. The processor 302 can be any custom made or commercially available processor, a CPU, an auxiliary processor among several processors associated with the user device 300, a semiconductor-based microprocessor (in the form of a microchip or chipset), or generally any device for executing software instructions. When the user device 300 is in operation, the processor 302 is configured to execute software stored within the memory 310, to communicate data to and from the memory 310, and to generally control operations of the user device 300 pursuant to the software instructions. In an embodiment, the processor 302 may include a mobile optimized processor such as optimized for power consumption and mobile applications. The I/O interfaces 304 can be used to receive user input from and/or for providing system output. User input can be provided via, for example, a keypad, a touch screen, a scroll ball, a scroll bar buttons, a barcode scanner, and the like. System output can be provided via a display device such as a liquid crystal display (LCD), touch screen, and the like.

The radio 306 enables wireless communication to an external access device or network. Any number of suitable wireless data communication protocols, techniques, or methodologies can be supported by the radio 306, including any protocols for wireless communication. The data store 308 may be used to store data. The data store 308 may include any of volatile memory elements (e.g., random access memory (RAM, such as DRAM, SRAM, SDRAM, and the like)), non-volatile memory elements (e.g., ROM, hard drive, tape, CDROM, and the like), and combinations thereof. Moreover, the data store 308 may incorporate electronic, magnetic, optical, and/or other types of storage media.

Again, the memory 310 may include any of volatile memory elements (e.g., random access memory (RAM, such as DRAM, SRAM, SDRAM, etc.)), non-volatile memory elements (e.g., ROM, hard drive, etc.), and combinations thereof. Moreover, the memory 310 may incorporate electronic, magnetic, optical, and/or other types of storage media. Note that the memory 310 may have a distributed architecture, where various components are situated remotely from one another, but can be accessed by the processor 302. The software in memory 310 can include one or more software programs, each of which includes an ordered listing of executable instructions for implementing logical functions. In the example of FIG. 11, the software in the memory 310 includes a suitable operating system 314 and programs 316. The operating system 314 essentially controls the execution of other computer programs and provides scheduling, input-output control, file and data management, memory management, and communication control and related services. The programs 316 may include various applications, add-ons, etc. configured to provide end user functionality with the user device 300. For example, example programs 316 may include, but not limited to, a web browser, social networking applications, streaming media applications, games, mapping and location applications, electronic mail applications, financial applications, and the like. In a typical example, the end-user typically uses one or more of the programs 316 along with a network such as the cloud-based system 100 (FIG. 9).

Although the present disclosure is illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following non-limiting claims for all purposes.

What is claimed is:

1. A method, comprising:
   receiving a plurality of transfer functions for a plurality of different parts of a full autonomous driving (AD) function general design space;
   combining the plurality of transfer functions to generate a general AD function multi-dimensional design space and analysis flow;
   defining a plurality of AD function dimensioning scenarios and loads to obtain related AD function sub-problem definitions and sub-design space analysis flows;
   incorporating robustness demands by applying a plurality of sigma targets to the dimensioning scenarios and loads and problem analysis flow objectives and constraints to identify design domain robust solutions considering noises and tolerances of input design parameters;
   applying one or more of weighed optimization and data mining to rank and extract interdependency patterns and relations among the dimensioning scenarios and design domain robust solutions to generate an AD function Sense-Act-interdependency relations map including AD system design parameters and AD function decision and control parameters; and controlling operation of an AD vehicle using the AD function Sense-Act-interdependency relations map as a look-up table stored in a memory and referenced by a processor of the AD vehicle to implement general Sense-Act-control capabilities of an AD system in the AD vehicle for general robust solution decision making with global situational awareness, closed-loop control, noise and system degradation-tolerance, and fail-safe management.

2. The method of claim 1, wherein receiving the plurality of transfer functions comprises creating Design Of Experiment (DOE)-based regression models that each relate an output response of a specific sub-design space including sub-design space output parameters to an input design parameter including sub-design space input parameters.

3. The method of claim 1, wherein combining the plurality of transfer functions comprises using multiple of the autonomous vehicle, an operational domain of the autonomous vehicle, sensors of the autonomous vehicle, a state estimation of the autonomous vehicle, and a motion control of the autonomous vehicle as a full general design space analysis flow that is equivalent to a full general AD function closed loop control and extends over all different feasible AD function dimensioning scenarios and loads.

4. The method of claim 1, wherein defining the plurality of AD function dimensioning scenarios and loads comprises creating sub-transfer functions of the dimensioning scenarios and loads and AD function sub-design space analysis flows utilizing a full general AD function multi-dimensional design space analysis flow where continuous and/or discrete sub-design space input parameters are considered.

5. The method of claim 1, wherein incorporating the robustness demands comprises considering an AD function performance with respect to the input design parameters with respect to different noises and tolerances, all considered simultaneously while looking for a desired AD function performance reliability.

6. The method of claim 1, wherein applying the one or more of the weighed optimization and the data mining to rank and extract interdependency patterns and relations among the dimensioning scenarios and design domain robust solutions comprises applying Multi Criteria Decision Making (MCDM)-weighed optimization to rank the robust solutions and Computer Aided Principle (CAP)-data clustering and Self Organizing Maps (SOM) to identify interdependency patterns among the robust solutions.

7. The method of claim 1, wherein the AD function Sense-Act-interdependency relations map comprises individual general robust solution input-output (I/O)-interdependency relation parameter value combinations versus full AD system input-output (I/O)-parameter ranges.

8. A non-transitory computer-readable medium comprising autonomous driving (AD) Sense-Act-system implementation instructions stored in a memory and executed by a processor to carry out the steps comprising:
receiving a plurality of transfer functions for a plurality of different parts of a full autonomous driving (AD) function general design space;
combining the plurality of transfer functions to generate a general AD function multi-dimensional design space and analysis flow;
defining a plurality of AD function dimensioning scenarios and loads to obtain related AD function sub-problem definitions and sub-design space analysis flows;
incorporating robustness demands by applying a plurality of sigma targets to the dimensioning scenarios and loads and problem analysis flow objectives and constraints to identify design domain robust solutions considering noises and tolerances of input design parameters;
applying one or more of weighed optimization and data mining to rank and extract interdependency patterns and relations among the dimensioning scenarios and design domain robust solutions to generate an AD function Sense-Act-interdependency relations map including AD system design parameters and AD function decision and control parameters; and
controlling operation of an AD vehicle using the AD function Sense-Act-interdependency relations map as a look-up table stored in a memory and referenced by a processor of the AD vehicle to implement general Sense-Act-control capabilities of an AD system in the AD vehicle for general robust solution decision making with global situational awareness, closed-loop control, noise and system degradation-tolerance, and fail-safe management.

9. The non-transitory computer-readable medium of claim 8, wherein receiving the plurality of transfer functions comprises creating Design Of Experiment (DOE)-based regression models that each relate an output response of a specific sub-design space including sub-design space output parameters to an input design parameter including sub-design space input parameters.

10. The non-transitory computer-readable medium of claim 8, wherein combining the plurality of transfer functions comprises using multiple of the autonomous vehicle, an operational domain of the autonomous vehicle, sensors of the autonomous vehicle, a state estimation of the autonomous vehicle, and a motion control of the autonomous vehicle as a full general design space analysis flow that is equivalent to a full general AD function closed loop control and extends over all different feasible AD function dimensioning scenarios and loads.

11. The non-transitory computer-readable medium of claim 8, wherein defining the plurality of AD function dimensioning scenarios and loads comprises creating sub-transfer functions of the dimensioning scenarios and loads and AD function sub-design space analysis flows utilizing a full general AD function multi-dimensional design space analysis flow where continuous and/or discrete sub-design space input parameters are considered.

12. The non-transitory computer-readable medium of claim 8, wherein incorporating the robustness demands comprises considering an AD function performance with respect to the input design parameters with respect to different noises and tolerances, all considered simultaneously while looking for a desired AD function performance reliability.

13. The non-transitory computer-readable medium of claim 8, wherein applying the one or more of the weighed optimization and the data mining to rank and extract interdependency patterns and relations among the dimensioning scenarios and design domain robust solutions comprises applying Multi Criteria Decision Making (MCDM)-weighed optimization to rank the robust solutions and Computer Aided Principle (CAP)-data clustering and Self Organizing Maps (SOM) to identify interdependency patterns among the robust solutions.

14. The non-transitory computer-readable medium of claim 8, wherein the AD function Sense-Act-interdependency relations map comprises individual general robust solution input-output (I/O)-interdependency relation parameter value combinations versus full AD system input-output (I/O)-parameter ranges.

15. A system, comprising:
an autonomous driving (AD) function Sense-Act-interdependency relations map stored as look-up table instructions in a memory and executed by a processor of an AD system of an AD vehicle and used for general robust solution decision making, wherein the AD function Sense-Act-interdependency relations map is generated and used by:
receiving a plurality of transfer functions for a plurality of different parts of a full AD function general design space;
combining the plurality of transfer functions to generate a general AD function multi-dimensional design space and analysis flow;
defining a plurality of AD function dimensioning scenarios and loads to obtain related AD function sub-problem definitions and sub-design space analysis flows;
incorporating robustness demands by applying a plurality of sigma targets to the dimensioning scenarios and loads and problem analysis flow objectives and constraints to identify design domain robust solutions considering noises and tolerances of input design parameters;
applying one or more of weighed optimization and data mining to rank and extract interdependency patterns and relations among the dimensioning scenarios and design domain robust solutions to generate the AD function Sense-Act-interdependency relations map including AD system design parameters and AD function decision and control parameters; and
controlling operation of the AD vehicle using the AD function Sense-Act-interdependency relations map as a look-up table to implement general Sense-Act-control capabilities of the AD system in the AD vehicle for the general robust solution decision making with global situational awareness, closed-loop control, noise and system degradation-tolerance, and fail-safe management.

16. The system of claim 15, wherein receiving the plurality of transfer functions comprises creating Design Of Experiment (DOE)-based regression models that each relate an output response of a specific sub-design space including sub-design space output parameters to an input design parameter including sub-design space input parameters.

17. The system of claim 15, wherein combining the plurality of transfer functions comprises using multiple of the autonomous vehicle, an operational domain of the autonomous vehicle, sensors of the autonomous vehicle, a state estimation of the autonomous vehicle, and a motion control of the autonomous vehicle as a full general design space analysis flow that is equivalent to a full general AD function closed loop control and extends over all different feasible AD function dimensioning scenarios and loads.

18. The system of claim 15, wherein defining the plurality of AD function dimensioning scenarios and loads comprises creating sub-transfer functions of the dimensioning scenarios and loads and AD function sub-design space analysis flows utilizing a full general AD function multi-dimensional design space analysis flow where continuous and/or discrete sub-design space input parameters are considered.

19. The system of claim 15, wherein incorporating the robustness demands comprises considering an AD function performance with respect to the input design parameters with respect to different noises and tolerances, all considered simultaneously while looking for a desired AD function performance reliability.

20. The system of claim 15, wherein the AD function Sense-Act-interdependency relations map comprises individual general robust solution input-output (I/O)-interdependency relation parameter value combinations versus full AD system input-output (I/O)-parameter ranges.

* * * * *